US010950827B2

United States Patent
Watanabe et al.

(10) Patent No.: US 10,950,827 B2
(45) Date of Patent: Mar. 16, 2021

(54) COATING-TYPE ORGANIC ELECTROLUMINESCENT DEVICE, AND A DISPLAY DEVICE AND LIGHTING DEVICE INCLUDING THE SAME

(71) Applicant: LG Display Co., Ltd., Seoul (KR)

(72) Inventors: Kazuki Watanabe, Paju-si (KR); Harumi Okuno, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/554,954

(22) Filed: Aug. 29, 2019

(65) Prior Publication Data

US 2020/0075901 A1 Mar. 5, 2020

(30) Foreign Application Priority Data

Aug. 30, 2018 (JP) .............................. JP2018-161272

(51) Int. Cl.
 *H01L 51/56* (2006.01)
 *H01L 51/00* (2006.01)
 (Continued)

(52) U.S. Cl.
 CPC .......... *H01L 51/56* (2013.01); *H01L 51/0004* (2013.01); *H01L 51/0022* (2013.01);
 (Continued)

(58) Field of Classification Search
 CPC ... H01L 27/30; H01L 27/3239; H01L 31/143; H01L 31/162; H01L 33/08; H01L 33/18;
 (Continued)

(56) References Cited

U.S. PATENT DOCUMENTS

2009/0256169 A1* 10/2009 Yokoyama .......... H01L 51/0096
257/98
2011/0248249 A1* 10/2011 Forrest ................ H01L 51/5036
257/40
(Continued)

FOREIGN PATENT DOCUMENTS

JP 2004-319504 A 11/2004
JP 2006-279007 A 10/2006
(Continued)

OTHER PUBLICATIONS

Korean Office Action dated Jul. 14, 2020 in a counterpart patent application KR 10-2019-0101182. (5 pages).

*Primary Examiner* — Moin M Rahman
(74) *Attorney, Agent, or Firm* — Polsinelli PC

(57) ABSTRACT

The present disclosure relates to a coating-type organic electroluminescent device and a display device and a lighting device including the same. The present disclosure relates to an organic electroluminescent device in which an interelectrode layer and at least one layer of a first electrode and a second electrode can be consistently manufactured at atmospheric pressure. The organic electroluminescent device includes a first electrode, an electron injection layer facing the first electrode, and an emitting material layer located between the first electrode and the electron injection layer, wherein the emitting material layer and the electron injection layer are formable by coating.

13 Claims, 3 Drawing Sheets

(51) Int. Cl.
  *H01L 51/50* (2006.01)
  *H01L 51/52* (2006.01)
(52) U.S. Cl.
  CPC ...... *H01L 51/5012* (2013.01); *H01L 51/5221* (2013.01); *H01L 51/004* (2013.01); *H01L 51/5092* (2013.01)
(58) Field of Classification Search
  CPC ... H01L 33/24; H01L 51/5032; H01L 25/048; H01L 27/288; H01L 27/32–3297; H01L 33/06; H01L 33/26; H01L 51/50–56; H01L 51/5068; H01L 51/5084; H01L 51/5296; H01L 2051/0032; H01L 2227/32; H01L 51/0085; H01L 51/006; H01L 51/0061; H01L 51/0074; H01L 51/5016; H01L 51/0059; H01L 51/0072; H01L 51/0052; H01L 51/0056; H01L 51/0058; H01L 2251/5376; H01L 2251/5384; H01L 2251/552; H01L 51/5012; H01L 51/504; H01L 51/0032–0095; H01L 2251/50–568; H01L 51/524–525; H01L 51/5209; H01L 27/3262; H01L 27/3258; H01L 27/3248; H01L 27/322; H01L 51/5225; H01L 51/5268; H01L 2251/558; H01L 2251/303; H01L 2251/306; H01L 2251/308; H01L 51/5218; H01L 52/5271; H01L 51/5275; H01L 51/0005; H01L 51/5206; H01L 51/5221; H01L 2227/323; H01L 27/3267; H01L 27/3246; H01L 27/3211; H01L 51/5281; H01L 51/5234; H01L 2251/5323; H01L 51/0097; H01L 2251/5338; H01L 51/0579; H01L 27/3244–3279; H01L 27/1214–1296; C09K 11/025; C09K 11/06; C09K 2211/1007; C09K 2211/1074; C09K 2211/185; C07D 239/26; C07D 241/12; C07D 333/76; C07D 409/10; C07D 471/04; C07D 209/86; C07F 15/0033; C07F 15/00; B32B 2457/206
  USPC ...... 257/13, 79–103, 918, 40, 642–643, 759
  See application file for complete search history.

(56) References Cited

U.S. PATENT DOCUMENTS

| | | | |
|---|---|---|---|
| 2014/0367617 A1* | 12/2014 | Yoshida | H01L 51/0039 252/500 |
| 2016/0126501 A1* | 5/2016 | Kim | G03F 7/0047 257/40 |
| 2016/0181562 A1* | 6/2016 | Pieh | H01L 51/5044 257/40 |

FOREIGN PATENT DOCUMENTS

| | | |
|---|---|---|
| JP | 2013-528232 A | 7/2013 |
| JP | 2014-111764 A | 6/2014 |
| JP | 2014-205643 A | 10/2014 |

* cited by examiner

COATING-TYPE ORGANIC ELECTROLUMINESCENT DEVICE, AND A DISPLAY DEVICE AND LIGHTING DEVICE INCLUDING THE SAME

CROSS-REFERENCE TO RELATED APPLICATION

This application claims the benefit of Japanese Patent Application No. 2018-161272, filed on Aug. 30, 2018, which is hereby incorporated by reference in its entirety.

BACKGROUND

Field of the Disclosure

The present disclosure relates to a display device, and more particularly, to a coating-type organic electroluminescent device and a display device and a lighting device including the same.

Description of the Background

Display devices using organic electroluminescent devices (OELDs) or organic light-emitting diodes are next-generation display devices having advantages of being thin, light weight, low power consumption, high contrast, and high response speed, and a technique for manufacturing the same is being rapidly advanced. Generally, an OELD includes a first electrode, a second electrode, and layers located between the first electrode and the second electrode. The layers include, for example, a hole injection layer (HIL), a hole transporting layer (HTL), an emissive layer (EML) or an emitting material layer (EML), an electron transporting layer (ETL), and an electron injection layer (EIL), and are manufactured by a vapor deposition method.

Meanwhile, coating-type OELDs have been proposed in order to reduce a manufacturing cost. Generally, in a method of manufacturing a coating-type OELD, a first electrode is formed by a deposition method, inter-electrode layers including an HIL, an HTL, an EML, and an ETL are formed by a coating method, and then an EIL and a second electrode are formed by the deposition method disclosed in Patent Document 1 and Non-Patent Documents 1 and 2 as follows: Patent Document 1: Japanese Patent Application Laid-Open No. 2006-279007 Non-Patent Document 1: Hua Zheng, Yina Zheng, Nanliu Liu, Na Ai, Qing Wang, Sha Wu, Junhong Zhou, Diangang Hu, Shufu Yu, Shaohu Han, Wei Xu, Chan Luo, Yanhong Meng, Zhixiong Jiang, Yawen Chen, Dongyun Li, Fei Huang, Jian Wang, Junbiao Peng, and Yong Cao, Nature Communications, 4, Article number: 1971 (2013). Non-Patent Document 2: Takayuki Chiba, Yong-Jin Pu, and Junji Kido, Journal of Materials Chemistry C, 3(44), 11567-11576 (2015).

SUMMARY

The present disclosure is directed to a coating-type OELD and a display device and a lighting device including the same that substantially obviate one or more of the problems associated with the limitations and disadvantages of the related conventional art.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the aspects of the disclosure, as described herein, an aspect of the disclosure is an organic electroluminescent device comprising: a first electrode; an electron injection layer facing the first electrode; and an emitting material layer between the first electrode and the electron injection layer, wherein the emitting material layer and the electron injection layer are formable by coating.

Another aspect of the disclosure is a display device, comprising: a substrate; an organic electroluminescent device over the substrate and including: a first electrode; an electron injection layer facing the first electrode; and an emitting material layer between the first electrode and the electron injection layer; and a thin film transistor between the substrate and the organic electroluminescent device and connected to the organic electroluminescent device, wherein the emitting material layer and the electron injection layer are formable by coating.

Another aspect of the disclosure is a lighting device, comprising: a substrate; and an organic electroluminescent device over the substrate and including: a first electrode; an electron injection layer facing the first electrode; and an emitting material layer between the first electrode and the electron injection layer, wherein the emitting material layer and the electron injection layer are formable by coating.

Another aspect of the disclosure is a method of manufacturing an organic electroluminescent device, includes: preparing a first electrode, coating a material for an emitting material layer on the first electrode, to form an emitting material layer, and coating a mixture of a material for an electron injection layer and a material for a second electrode on the emitting material layer.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate aspects of the present disclosure and together with the description serve to explain the principles of the present disclosure.

In the drawings.

DETAILED DESCRIPTION

Figure 1:
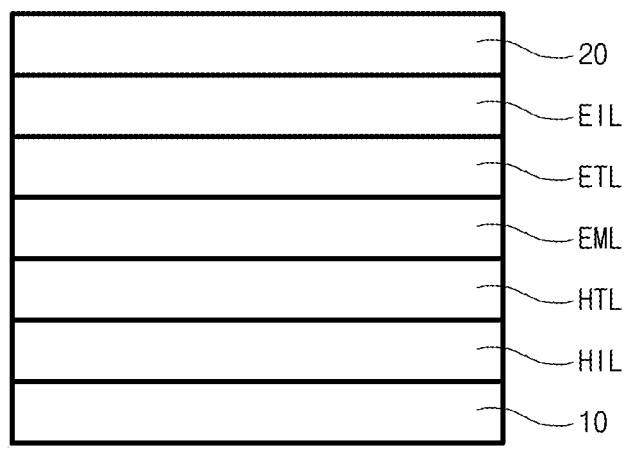
FIG. 1 is a schematic cross-sectional view showing an organic electroluminescent device according to the present disclosure.

Hereinafter, aspects of the present disclosure will be described in detail. The present disclosure is not limited to the aspects described below, and modifications and changes can be performed without departing from the scope of the present disclosure.

<Organic Electroluminescent Device>

An organic electroluminescent device of the present disclosure includes a first electrode, a second electrode, an emitting material layer EML, and an electron injection layer EIL, wherein the electron injection layer EIL may form one layer with the first electrode or the second electrode. For example, the organic electroluminescent device may include the first electrode, the emitting material layer and the electron injection layer without the second electrode. The emitting material layer, the electron injection layer, and at least one of the first electrode and the second electrode may be formed by coating. Further, each of the above layers does not need to have a clear boundary and may be formed as a plurality of layers, for example, a layer in which the second electrode and the electron injection layer are mixed.

In one aspect of the present disclosure, a thickness of each layer of inter-electrode layers is not particularly limited, and a lower limit thereof may be 5 nm or more, or 10 nm or more, or 20 nm or more. In addition, an upper limit of the thickness may be 100 nm or less, or 90 nm or less, or 80 nm or less. A lower limit of a total thickness of the first electrode and the second electrode may be 100 nm more, or 200 nm or more, or 300 nm or more. In addition, an upper limit of the total thickness may be 2,000 nm less, or 1,000 nm or less, or 500 nm or less.

<First Electrode and Second Electrode>

The first electrode is formed of an anode material or a cathode material. For example, when the first electrode is formed of an anode material, the first electrode is formed of a metal, a metal oxide, or a conductive polymer. The conductive polymer may include a dopant. Examples of the material constituting the first electrode include carbon, magnesium, aluminum, calcium, vanadium, chromium, copper, zinc, molybdenum, silver, iridium, gold, titanium, palladium, other metals, and an alloy thereof. For example, the first electrode may include zinc oxide, fluorine-doped tin oxide (FTO), indium tin oxide (ITO), indium zinc oxide (IZO), and other metal oxides similar thereto.

The second electrode is formed of an anode material or a cathode material. For example, when the second electrode is formed of a cathode material, the second electrode may be formed of a material having a low work function to facilitate electron injection. The second electrode is not limited thereto, and the second electrode is formed as a layer made of a metal, such as magnesium, calcium, sodium, potassium, titanium, indium, yttrium, lithium, gadolinium, aluminum, silver, tin, or lead, or an alloy thereof and is formed as a laminate, a laminate of metal/metal oxide such as Ca/IZO, or a laminate of metal salt/metal such as LiF/Al or $Li_2O$/Al.

The first electrode and the second electrode may include different materials among the above-described materials. In addition, the first electrode and the second electrode are not distinguished by geometric positions or manufacturing order. When one of the first electrode and the second electrode functions as a cathode, the other should function as an anode.

When a material having a high reflectivity is used for one electrode of the first electrode and the second electrode, the one electrode may also be used as a reflective layer. Generally, an extraction direction of light is designed as an opposite direction of the reflective layer. However, the extraction direction may be designed as either of a cathode side direction or an anode side direction. When a transparent organic light-emitting diode (OLED) is manufactured, both of a first electrode and a second electrode may be at least partially transparent and an Mg-Ag film, a thin Ag film, or the like is used. An ITO film or the like may be provided below an Ag film, or a laminated film in which an Ag film is interposed between upper and lower films may be provided as an ITO film.

A method of manufacturing the first electrode and the second electrode is not particularly limited and may be performed using a vapor deposition method, a sputtering method, or the like or may be performed using various types of coating methods. However, the method may be a method in which at least one of the first electrode and the second electrode is manufactured at atmospheric pressure. Examples of the method of forming the first electrode and the second electrode at atmospheric pressure may include various types of coating methods and, specifically, may include a spin coating method, an ink-jet method, an electrostatic coating method, a method using ultrasonic atomization, a slit coating method, a die coating method, a screen printing method, and the like. When the first electrode and the second electrode is formed using a coating method, ink may be generally used as a raw material of the first electrode and the second electrode. Examples of the ink may include ink in which fine particles obtained by refining an electrode material are distributed, ink in which an electrode material is dissolved, ink designed to generate an electrode material by reaction after coating, and the like.

<Layer Configuration>

FIG. 1 is a schematic cross-sectional view showing an organic electroluminescent device according to the present disclosure. As shown in FIG. 1, the organic electroluminescent device of the present disclosure may include a first electrode 10 as an anode, a second electrode 20 as a cathode facing the first electrode 10, and an emitting material layer EML and an electron injection layer EIL, which are capable of being formed by coating, between the first and second electrodes 10 and 20. The electron injection layer EIL serves as the second electrode 20, and the second electrode 20 can be omitted. A hole auxiliary layer including at least one of a hole injection layer HIL and a hole transporting layer HTL may be further provided between the first electrode 10 and the emitting material layer EML, and an electron auxiliary layer including an electron transporting layer ETL may be further provided between the emitting material layer EML and the electron injection layer EIL. For example, the following aspects may be provided.

(Aspect 1 of Layer Configuration)

An organic electroluminescent device is provided in which films are formed in the order of a first electrode, a hole injection layer, a hole transporting layer, an emitting material layer, an electron transporting layer, an electron injection layer, and a second electrode, and the first electrode is manufactured by a deposition method and the hole transporting layer to the second electrode are manufactured by a coating method.

(Aspect 2 of Layer Configuration)

An organic electroluminescent device is provided in which films are formed in the order of a first electrode, an electron injection layer, an electron transporting layer, an emitting material layer, a hole transporting layer, a hole injection layer, and a second electrode, and the first electrode is manufactured by a deposition method and the electron injection layer to the second electrode are manufactured by a coating method.

(Aspect 3 of Layer Configuration)

An organic electroluminescent device is provided in which films are formed in the order of a first electrode, a hole injection layer, a hole transporting layer, an emitting material layer, an electron transporting layer, and an electron injection layer, and the electron injection layer serves as a second electrode. The first electrode is manufactured by a deposition method, and the hole injection layer to the electron injection layer are manufactured by a coating method.

(Aspect 4 of Layer Configuration)

An organic electroluminescent device is provided in which films are formed in the order of a first electrode, a hole injection layer, a hole transporting layer, an emitting material layer, an electron transporting layer, an electron injection layer, and a second electrode, and all of the first electrode to the second electrode are manufactured by a coating method.

In addition, the organic electroluminescent devices of the present disclosure may include a plurality of emitting material layers. In this instance, the organic electroluminescent device may further include a charge generation layer (CGL) between the emitting material layer and another emitting material layer. When the organic electroluminescent device includes the plurality of emitting material layers, light-emitting materials constituting the emitting material layers may be the same or different, or some of the light-emitting materials may be the same. Further, one emitting material layer may include a plurality of light-emitting materials. When an electroluminescent device in which a plurality of light emission colors are obtained from a single electroluminescent device is used, a display device capable of reproducing color information may be configured by combining with a color filter or the like.

<Emitting Material Layer>

The organic electroluminescent device of the present disclosure includes an emitting material layer that can be formed by coating. In the emitting material layer, electrons and holes, which are injected from the first electrode and the second electrode, respectively, are combined with each other to form excitons, and the excitons are transited to a ground state to emit light. In one aspect of the present disclosure, the emitting material layer may be formed of an organic material including a phosphor or a fluorescent material and may emit a predetermined amount of light. Examples of the material of the emitting material layer are shown below, but the present disclosure is not limited thereto. (In the following chemical formulas, each of n, x, y, and z is a positive integer. However, each of x and y in Chemical Formulas 6 and 32 and a, b, c, and d in Chemical Formula 45 is a rational number, wherein x+y=1 and a+b+c+d=1.)

[Formula 1]

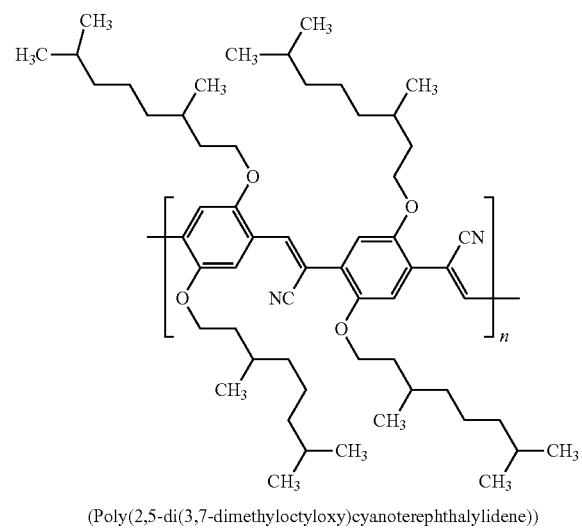

(Poly(2,5-di(3,7-dimethyloctyloxy)cyanoterephthalylidene))

[Formula 2]

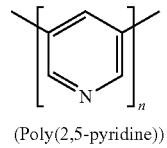

(Poly(2,5-pyridine))

[Formula 3]

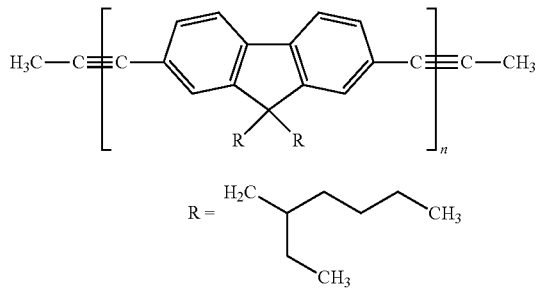

(Poly(9,9-di(2'-ethylhexyl)fluorene-2,7-yleneethynylene))

[Formula 4]

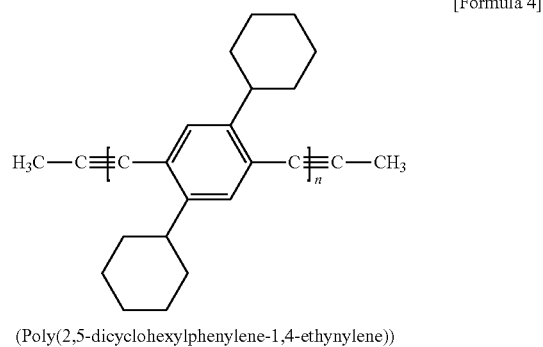

(Poly(2,5-dicyclohexylphenylene-1,4-ethynylene))

[Formula 5]

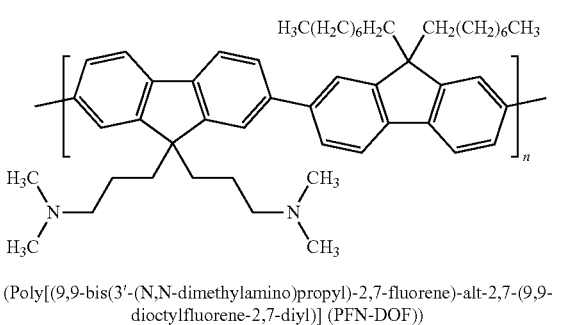

(Poly[(9,9-bis(3'-(N,N-dimethylamino)propyl)-2,7-fluorene)-alt-2,7-(9,9-dioctylfluorene-2,7-diyl)] (PFN-DOF))

[Formula 6]

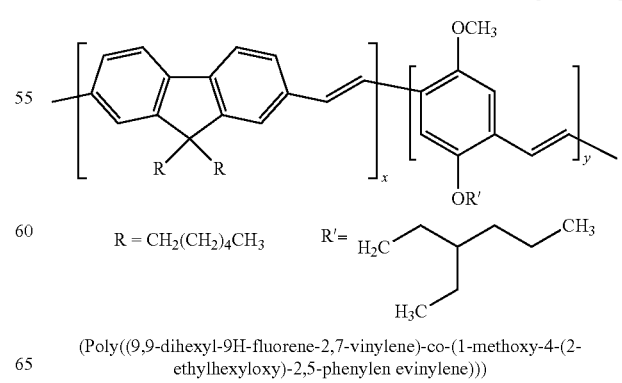

(Poly((9,9-dihexyl-9H-fluorene-2,7-vinylene)-co-(1-methoxy-4-(2-ethylhexyloxy)-2,5-phenylen evinylene)))

[Formula 7]

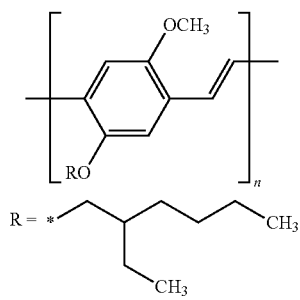

(Poly[2-methoxy-5-(2-ethylhexyloxy)-1,4-phenylenevinylene] (MEH-PPV))

[Formula 8]

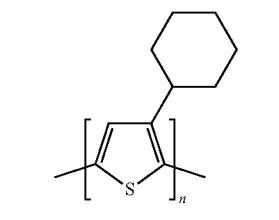

(Poly(3-cyclohexylthiophene-2,5-diyl))

[Formula 9]

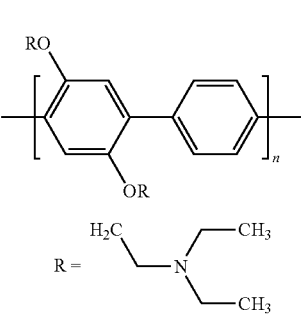

(Poly{[2,5-bis(2-(N,N-diethylamino)ethoxy)-1,4-phenylene]-alt-1,4-phenylene})

[Formula 10]

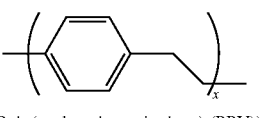

(Poly(p-phenylene vinylene) (PPV))

[Formula 11]

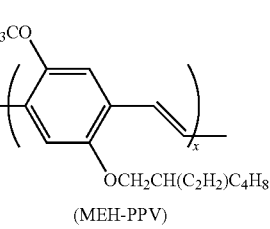

(MEH-PPV)

[Formula 12]

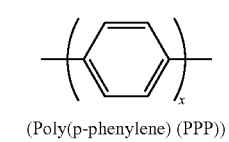

(Poly(p-phenylene) (PPP))

[Formula 13]

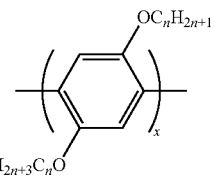

(Poly(2-alkoxy-p-phenylene) (RO-PPP))

[Formula 14]

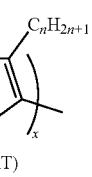

(PAT)

[Formula 15]

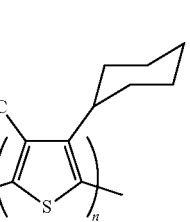

(Poly(3-cyclohexyl-4-methylthiophene) (PCHMT))

[Formula 16]

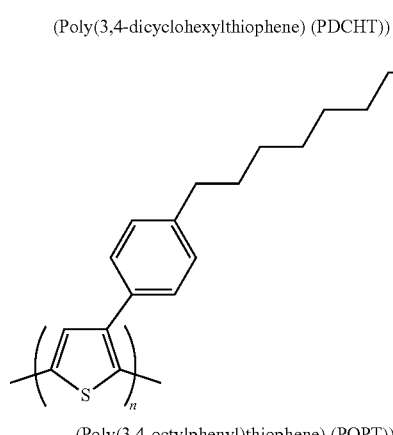

(Poly(3,4-dicyclohexylthiophene) (PDCHT))

[Formula 17]

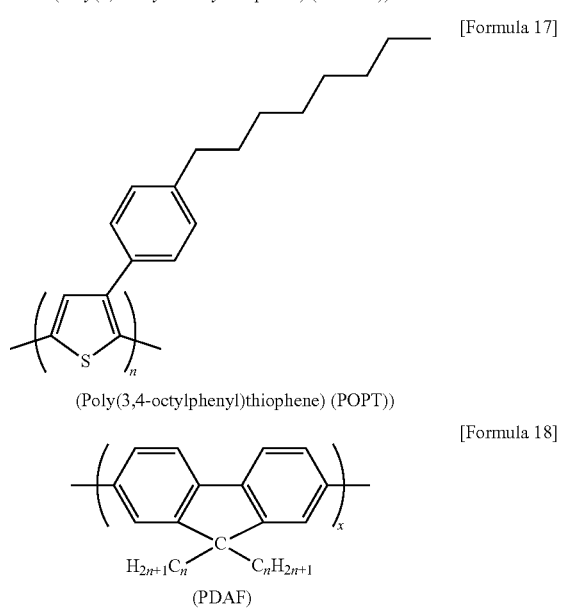

(Poly(3,4-octylphenyl)thiophene) (POPT))

[Formula 18]

(PDAF)

[Formula 19]

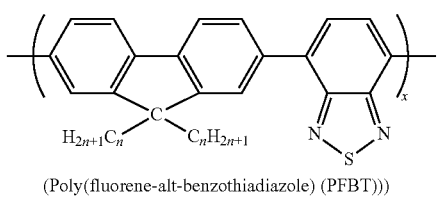

(Poly(fluorene-alt-benzothiadiazole) (PFBT)))

[Formula 20]

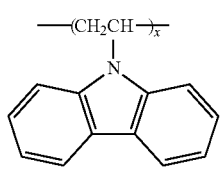

(Poly(n-vinyl carbazole) (PVK))

[Formula 21]

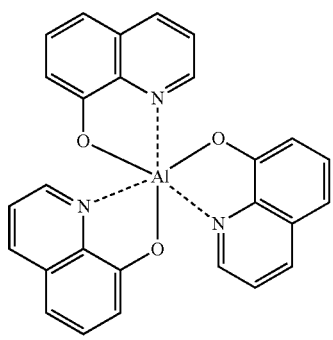

(Tris(8-hydroxyquinolinato)aluminum)

[Formula 22]

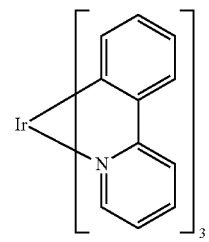

(Tris(2-phenylpyridinato)iridium(III) (Ir(ppy)3))

[Formula 23]

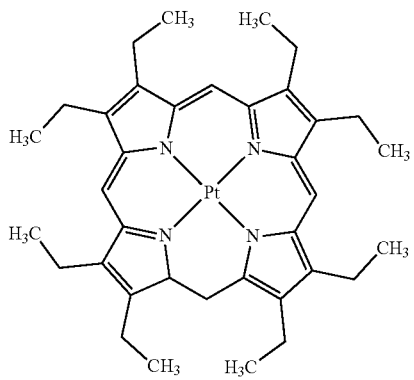

(Platinum octaethylporphyrin (PtOEP))

[Formula 24]

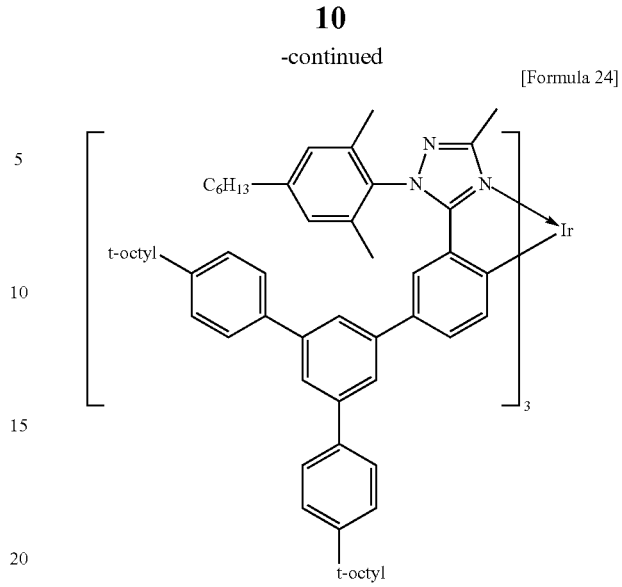

In addition to the above compounds, for example, compounds which are described in Japanese Patent Application Publication No. 2014-205643, Japanese Patent Publication No. 2013-528232, and Japanese Patent Application Publication No. 2014-111764 may be used.

In another aspect of the present disclosure, a light-emitting material of an emitting material layer includes an inorganic halide.

The inorganic halide, which is the light-emitting material of the emitting material layer of the present aspect, may be a liquid crystal type metal halide.

Further, the inorganic halide, which is the light-emitting material of the emitting material layer of the present aspect, may be a metal halide expressed by a formula $A_m B_n X_p$.

In the above formula, A denotes a cation selected from the group consisting of $Cs^+$, $Rb^+$, $K^+$, $Na^+$, and $Li^+$, B denotes a cation selected from the group consisting of $Pb^{2+}$, $Sn^{2+}$, and $Ge^{2+}$, and X denotes an anion selected from the group consisting of $Cl^-$, $Br^-$, and $I^-$. Each of m, n, and p independently represents a positive integer. In addition, p is an integer of 3 or more. Further, m, n, and p may be represented as fractions or decimals but are read in a format expressed by integers. Further, generally, an elemental composition of a metal halide may not strictly be an integer due to irregularity of the composition, but the irregularity and error of the metal halide of the present disclosure are allowed.

Furthermore, the inorganic halide, which is the light-emitting material of the emitting material layer of the present aspect, may be a metal halide expressed by a formula, $A_1 B_1 X_3$, or a formula, $A_4 B_1 X_6$.

As described above, the light-emitting material of the present aspect may be manufactured by dissolving a precursor material of the light-emitting material into an organic solvent by stirring and by performing vacuum drying thereon at room temperature.

<Electron Injection Layer>

The organic electroluminescent device of the present disclosure includes an electron injection layer that can be formed by coating. The electron injection layer is a layer for injecting electrons from an electrode, has the ability to transport electrons, and has an electron injection effect from a cathode. The electron injection layer may be formed of a compound having an excellent ability to form a thin film. Examples of the material of the electron injection layer are shown below, but the present disclosure is not limited thereto. The electron injection layer includes at least one of the following materials.

An alkali metal or second-group element-containing compound

[Formula 25]

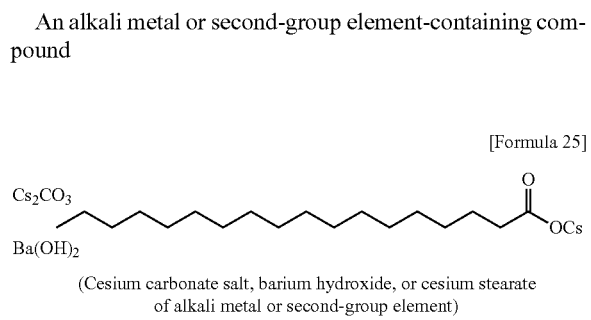

$Cs_2CO_3$ $Ba(OH)_2$ (Cesium carbonate salt, barium hydroxide, or cesium stearate of alkali metal or second-group element)

A surface modifying intermediate layer

[Formula 26]

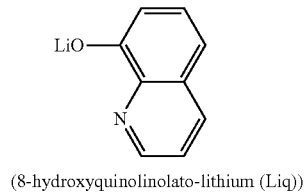

(8-hydroxyquinolinolato-lithium (Liq))

[Formula 27]

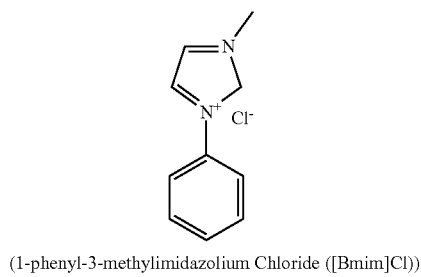

(1-phenyl-3-methylimidazolium Chloride ([Bmim]Cl))

[Formula 28]

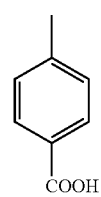

[Formula 29]

[Formula 30]

(Ethanolamine)

An ionic compound

[Formula 31]

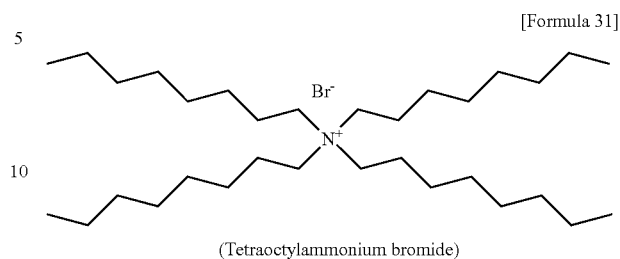

(Tetraoctylammonium bromide)

[Formula 32]

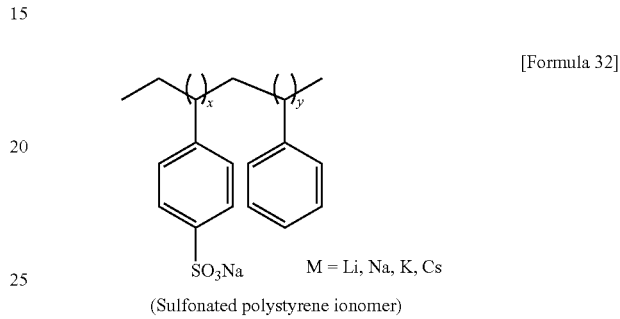

M = Li, Na, K, Cs (Sulfonated polystyrene ionomer)

[Formula 33]

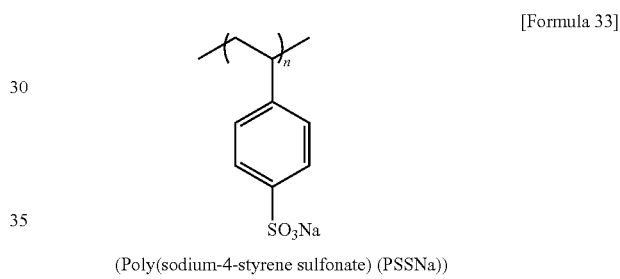

(Poly(sodium-4-styrene sulfonate) (PSSNa))

[Formula 34]

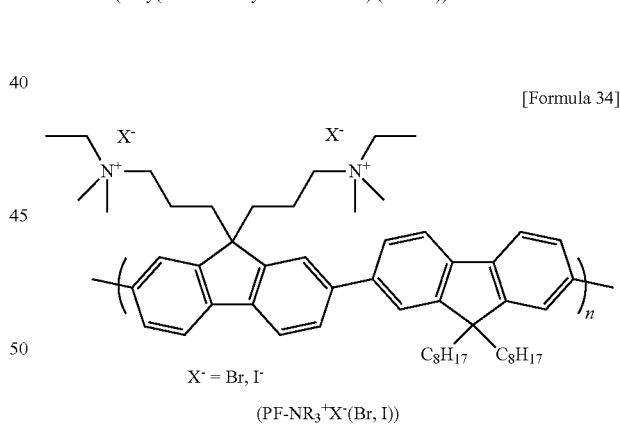

$X^- = Br^-, I^-$ (PF-NR$_3^+$X$^-$(Br, I))

[Formula 35]

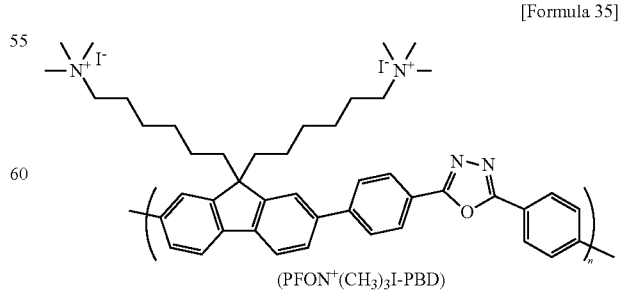

(PFON$^+$(CH$_3$)$_3$I-PBD)

An amphoteric ion electrolyte
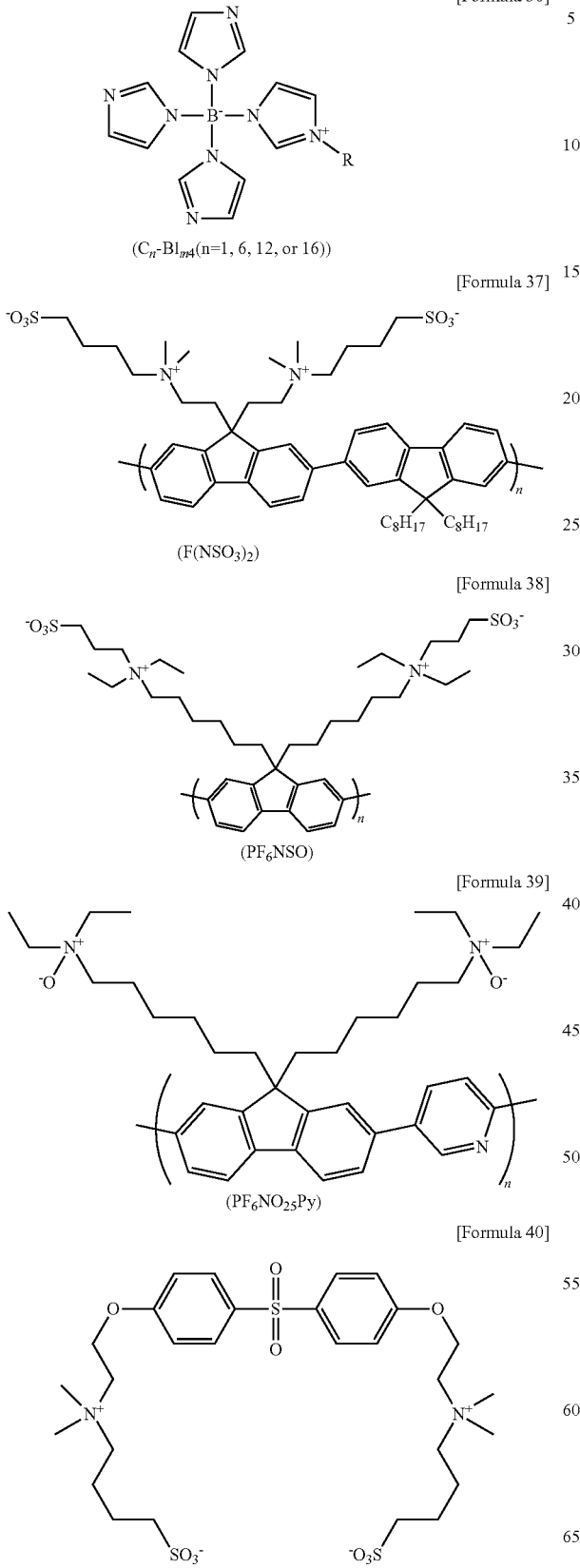
[Formula 36] (C$_n$-BI$_{m4}$(n=1, 6, 12, or 16))
[Formula 37] (F(NSO$_3$)$_2$)
[Formula 38] (PF$_6$NSO)
[Formula 39] (PF$_6$NO$_{25}$Py)
[Formula 40]
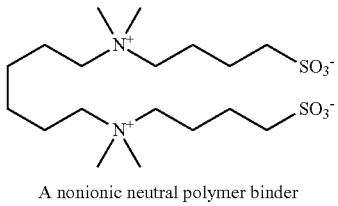
[Formula 41]
A nonionic neutral polymer binder
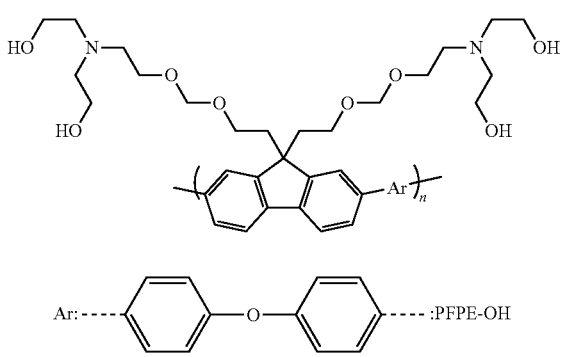
[Formula 42]
Ar: ----⟨phenyl⟩-O-⟨phenyl⟩---- :PFPE-OH
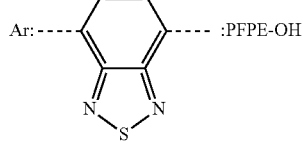
Ar: ----⟨benzothiadiazole⟩---- :PFPE-OH
Ar: :PF-OH
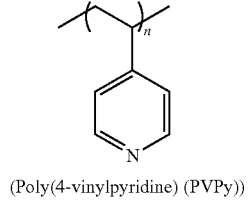
[Formula 43]
(Poly(4-vinylpyridine) (PVPy))
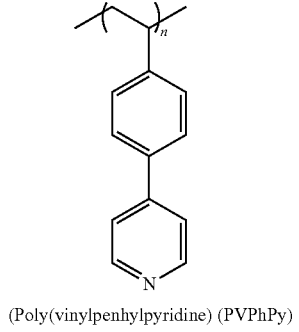
[Formula 44]
(Poly(vinylpenhylpyridine) (PVPhPy))

A nonionic non-conjugated polymer

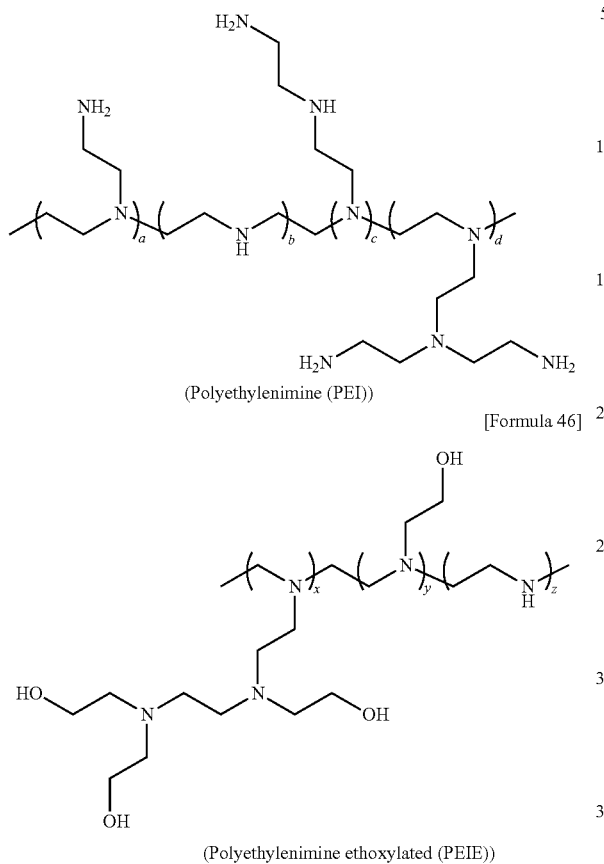

(Polyethylenimine (PEI)) [Formula 45]

(Polyethylenimine ethoxylated (PEIE)) [Formula 46]

By dissolving the above materials into a protonic solvent such as water, alcohol, or a water-alcohol mixed solvent, the materials may be used for forming a film by coating. Meanwhile, when the above materials obtained by being dissolved into the protonic solvent are used as an electron injection layer, it has become clear that the protonic solvent may lower the lifespan of the organic electroluminescent device.

Therefore, from the viewpoint of the lifespan of the organic electroluminescent device, the electron injection layer of another aspect of the present disclosure may be manufactured from a composition which contains an aprotic organic solvent and in which a monomer of an alkali metal or a second group element is dissolved. The electron injection layer may be manufactured from a composition which contains an aprotic solvent and in which a metal sodium monomer is dissolved. Examples of the aprotic solvent, in which the metal sodium monomer may be dissolved, may be N,N'-dimethylethyleneurea, N,N-dimethylacetamide, or N,N'-dimethylpropyleneurea.

Here, the sentence "a metal monomer is dissolved" means that metal monomers, not metal ions, are present in a solvent and does not include a state in which a metal salt is dissolved in the solvent. Further, since the composition is not a composition in which the metal salt is dissolved so that the conductivity is high and a resistance value is low, a layer serving the second electrode as well as the electron injection layer may be formed by the composition, in which the monomer of the alkali metal or the second group element is dissolved.

<Hole Transporting Layer>

In one aspect of the present disclosure, the organic electroluminescent device includes a hole transporting layer that can be formed by coating. The hole transporting layer is not particularly limited as long as it can be formed by coating and can function to smoothly transfer holes injected from the first electrode (anode) to the emitting material layer. However, a material having a high hole mobility may be used. Next, examples of the material of the hole transporting layer are shown below, but the present disclosure is not limited thereto.

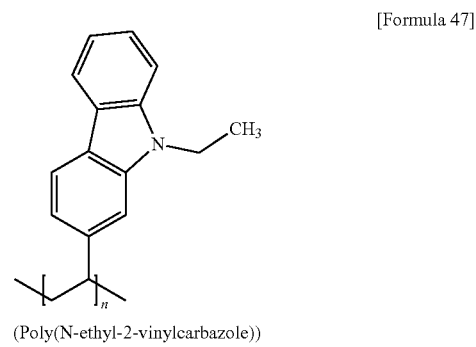

(Poly(N-ethyl-2-vinylcarbazole)) [Formula 47]

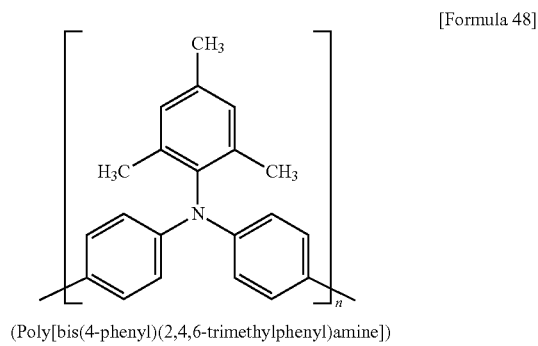

(Poly[bis(4-phenyl)(2,4,6-trimethylphenyl)amine]) [Formula 48]

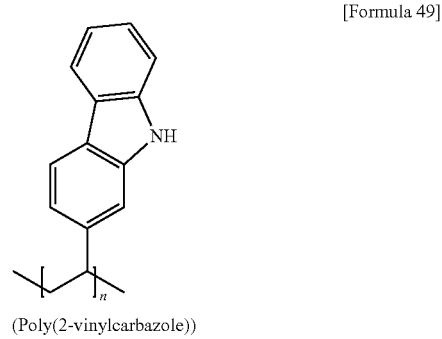

(Poly(2-vinylcarbazole)) [Formula 49]

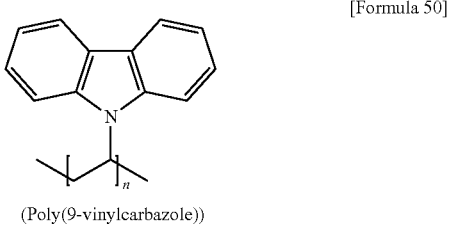

(Poly(9-vinylcarbazole)) [Formula 50]

-continued

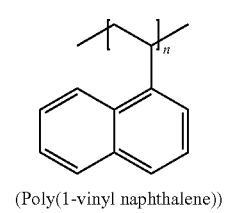

(Poly(1-vinyl naphthalene)) [Formula 51]

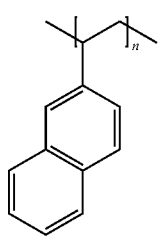

(Poly(2-vinyl naphthalene)) [Formula 52]

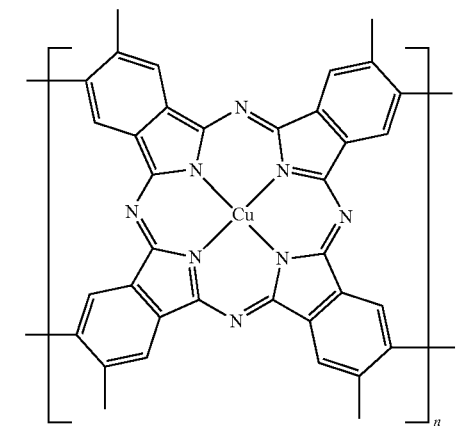

(Poly(copper phthalocyamine)) [Formula 53]
Nickel(II) oxide nanoparticles
Tin(II) oxide nanoparticles
Silver(I) oxide nanoparticles
Copper (I) oxide nanoparticles
Chrominum(III) oxide nanoparticles In addition to the above compounds, for example, the compounds described in Japanese Patent Publication No. 2013-528232 and Japanese Patent Application Publication No. 2014-111764 and the inorganic halides exemplified as the light-emitting materials of the emitting material layer may be used.

<Electron Transporting Layer>

In one aspect of the present disclosure, the organic electroluminescent device includes an electron transporting layer that can be formed by coating. The material of the transporting layer is not particularly limited as long as it can appropriately receive electrons injected from a cathode and can appropriately transport the electrons to the emitting material layer. However, a material having a high electron mobility may be used. Examples of the material of the electron transporting layer are shown below, but the present disclosure is not limited thereto.

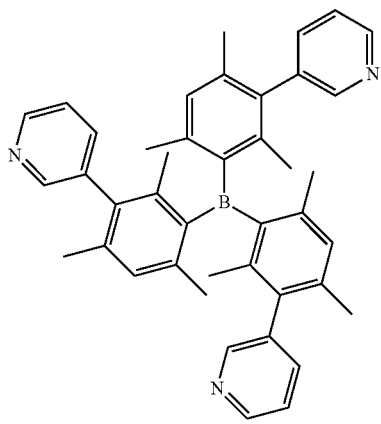

(Tri[3-(pyridyl)mesityl]borane (3TPYMB)) [Formula 54]

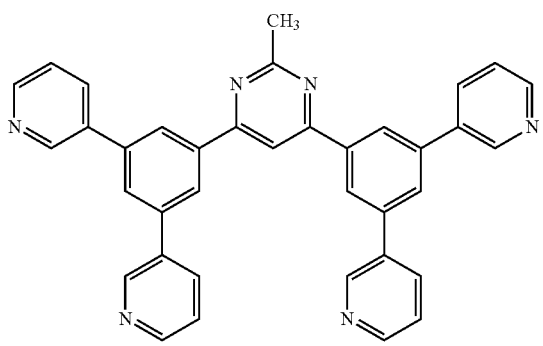

(4,6-Bis(3,5-di(pyridin-3-yl)phenyl)-2-methylpyrimidine (B3PYMPM)) [Formula 55]

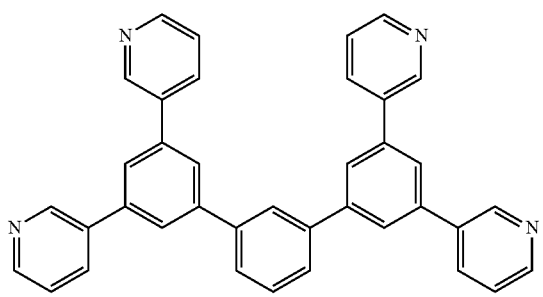

(1,3-Bis(3,5-di(pyridin-3-yl)phenyl)benzene (B3PyPB)) [Formula 56]

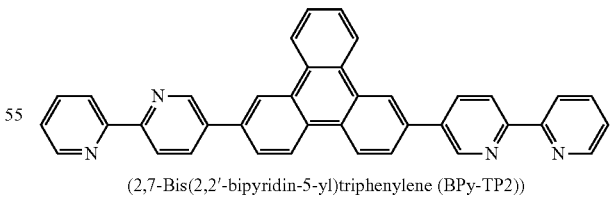

(2,7-Bis(2,2′-bipyridin-5-yl)triphenylene (BPy-TP2)) [Formula 57]

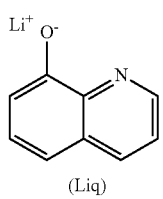

(Liq) [Formula 58]

[Formula 59]

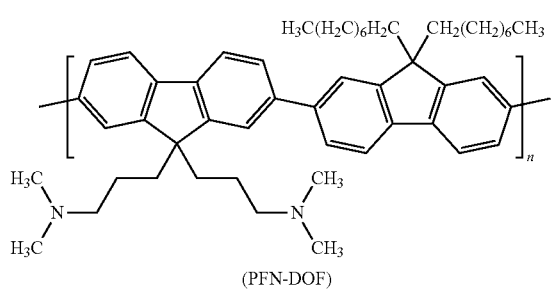

(PFN-DOF)

[Formula 60]

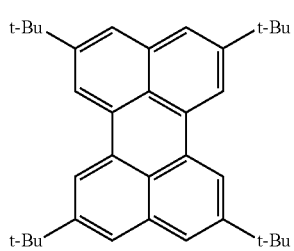

(1,4,7,10-tetra(tert-butyl)perpylene (TBPe))
Tin(IV) oxide nanoparticle
Titanium(IV) oxide nanoparticles
Zinc(II) oxide nanoparticles
Indium(III) oxide nanoparticles

[Formula 61]

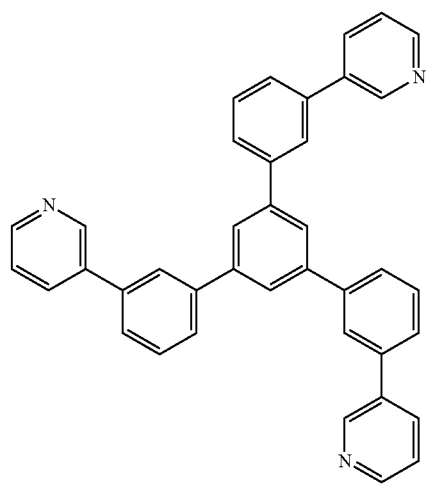

(1,3,5-Tri(m-pyridin-3-ylphenyl)benzene (TmPyPB))

[Formula 62]

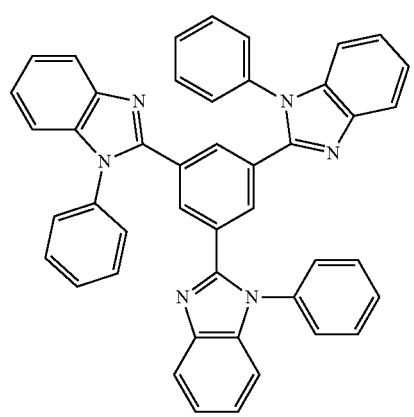

(2,2′,″-(1,3,5-benzinetriyl)-tris(1-phenyl-1-h-benzimidazole) (TPBi))

[Formula 63]

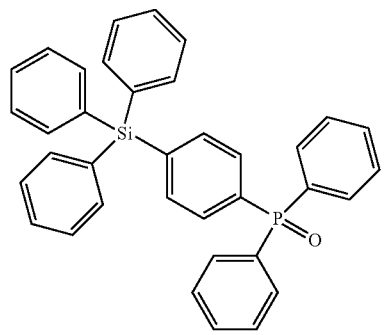

(Diphenyl[4-(triphenylsilyl)phenyl]phosphine oxide (TSPO1))

[Formula 64]

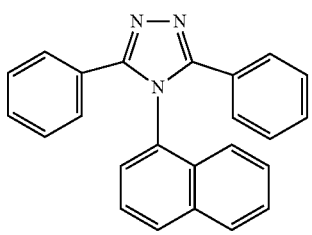

(3,5-diphenyl-4-(1-naphthyl)-1H-1,2,4-triazole)

[Formula 65]

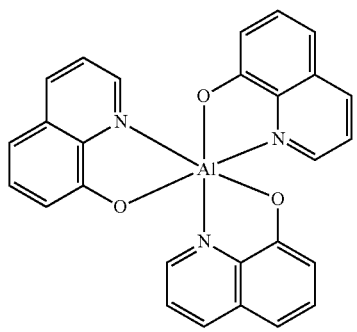

(Tris(8-hydroxyquinoline)aluminum)

[Formula 66]

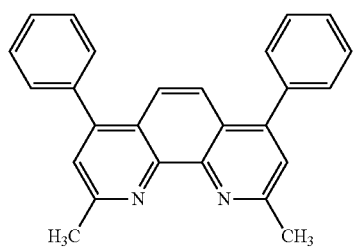

(Bathocuproine)

[Formula 67]

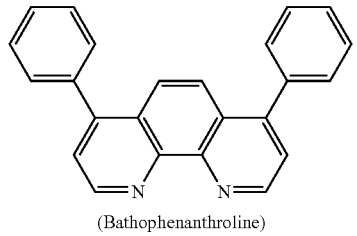

(Bathophenanthroline)

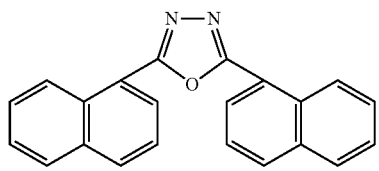

(2,5-Bis(1-naphthyl)-1,3,4-oxadiazole)

[Formula 68]

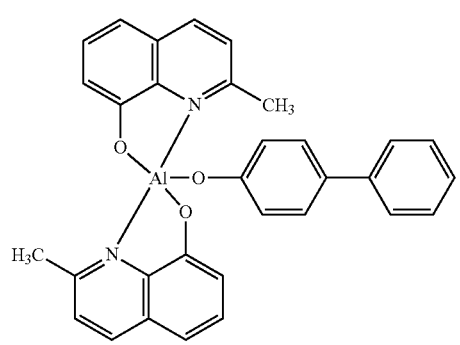

(Bis(8-hydroxy-2-methylquinoline)-(4-phenylphenoxy)aluminum)

[Formula 69]

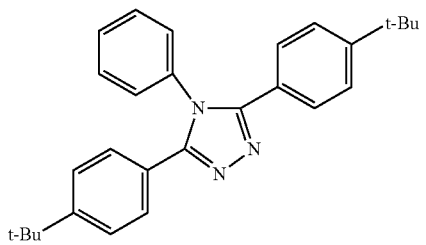

(3,5-bis(4-tert-butylphenyl)-4-phenyl-4H-1,2,4-triazole)

[Formula 70]

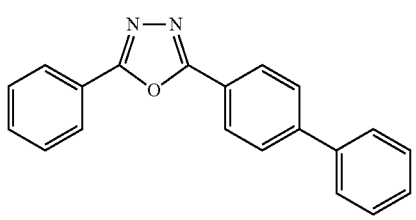

(2-(4-biphenyl)-5-phenyl-1,3,4-oxadiazole)

[Formula 71]

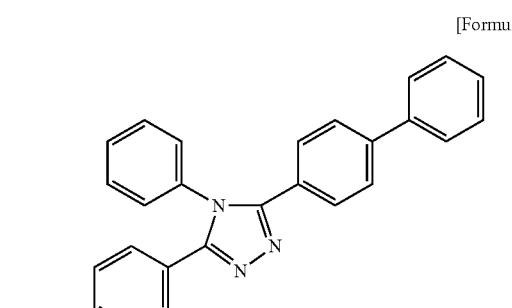

(3-(biphenyl-4-yl)-5-(4-tert-butylphenyl)-4-phenyl-4H-1,2,4-triazole)

[Formula 72]

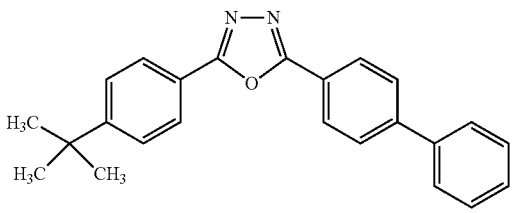

(2-(4-tert-butylphenyl)-5-(4-biphenylyl)-1,3,4-oxadiazole)

[Formula 73]

In addition to the above compounds, for example, the compounds which are described in Japanese Patent Publication No. 2013-528232 and Japanese Patent Application Publication No. 2014-111764, and the inorganic halides exemplified as the light-emitting materials of the emitting material layer may be used.

<Hole Injection Layer HIL>

In one aspect of the present disclosure, the organic electroluminescent device includes a hole injection layer that can be formed by coating. The hole injection layer is a layer for injecting holes from an electrode. A hole injection material, which has the ability to transport holes, a hole injection effect from the anode, an excellent hole injection effect on the emitting material layer or the light-emitting material, and excellent ability to form a thin film and can prevent migration of excitons generated in the emitting material layer to the electron injection layer or the electron injection material, can be used for the hole injection layer. Examples of the material of the hole injection layer are shown below, but the present disclosure is not limited thereto.

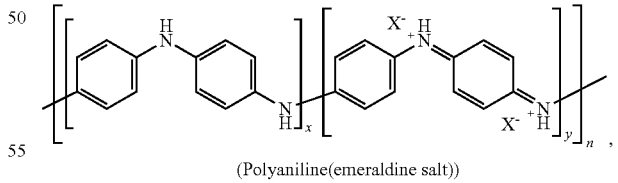

(Polyaniline(emeraldine salt))

[Formula 74]

In Chemical Formula 74, $X^-$ may include an anion of inorganic acid that may be one of hydrochloric acid, sulfuric acid, nitric acid, borofluoric acid, perchloric acid, and amidosulfuric acid, an anion of organic acid that may be one of benzenesulfonic acid, p-toluenesulfonic acid, m-nitrobenzoic acid, trichloroacetic acid, acetic acid, and propionic acid, or an anion of polymeric acid that may be one of polystyrene sulfonic acid, polyvinyl sulfonic acid, and polyvinyl sulfuric acid.

[Formula 75]

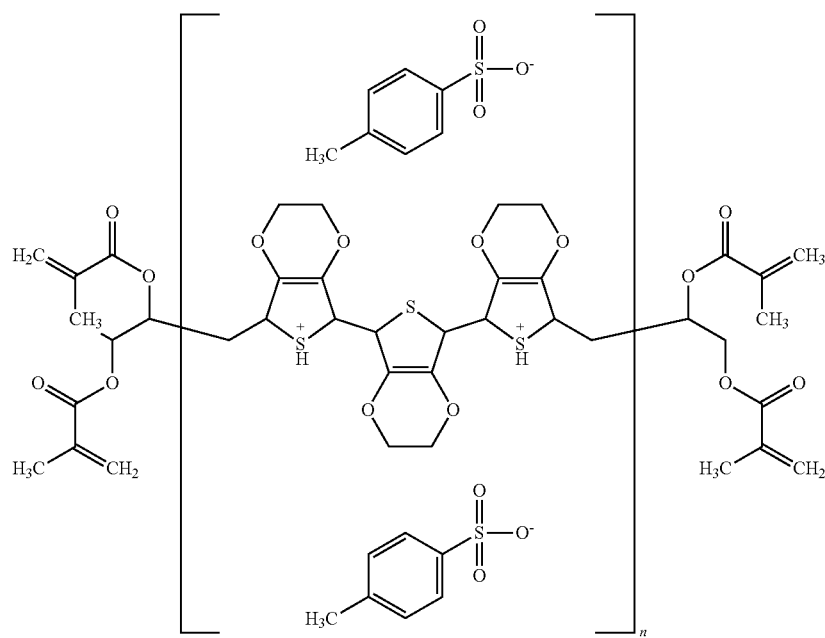

(a material including poly(3,4-ethylenedioxythiophene) and tetramethacrylate terminal cap)

[Formula 76]

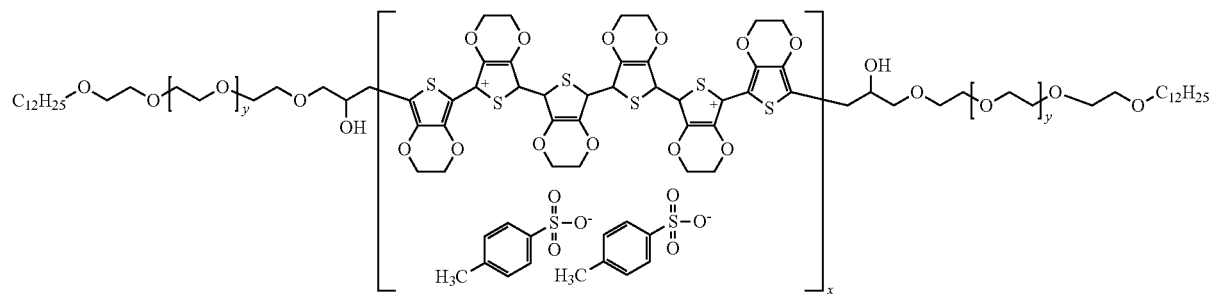

(a material containing poly(3,4-ethylenedioxythiophene), bis-poly(ethylene glycol, lauryl terminal, and p-toluene sulfonic acid)

[Formula 77]

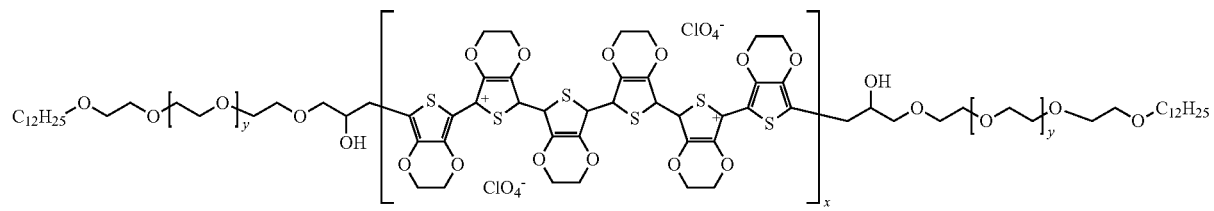

(a material containing poly(3,4-ethylenedioxythiophene), bis-poly(ethylene glycol), lauryl terminal, and perchloric acid)
Poly(3,4-ethylenedioxythiophene)-block-poly(ethylene glycol) solution

[Formula 78]

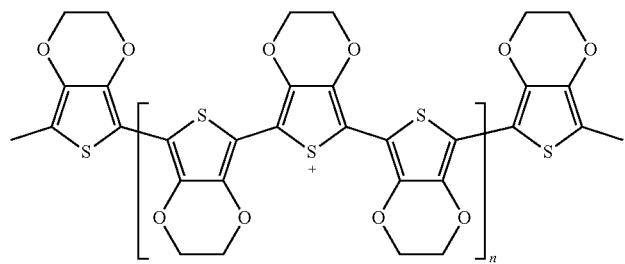

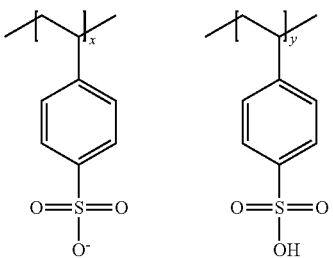

(Poly(3,4-ethylenedioxythiophene)-poly(styrenesulfonate))

[Formula 79]

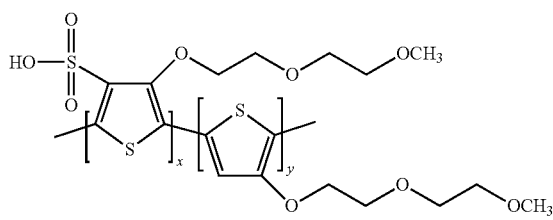

(sulfonated solution of poly(thiophen-3-[2-(2-methoxyethxy)ethoxy]-2,5-diyl))

In addition to the above compounds, for example, the compounds which are described in Japanese Patent Publication No. 2013-528232 and Japanese Patent Application Publication No. 2014-111764 and the inorganic halides exemplified as the light-emitting materials of the emitting material layer may be used.

<Method of Manufacturing Organic Electroluminescent Device>

A method of manufacturing an organic electroluminescent device according to an aspect of the present disclosure includes a process of preparing a first electrode, a process of coating a material of an emitting material layer and a material of an electron injection layer on the first electrode, and a process of coating a material of a second electrode on the electron injection layer.

A method of manufacturing an organic electroluminescent device according to another aspect of the present disclosure includes a process of preparing a first electrode, a process of coating a material of an emitting material layer, a process of coating a mixture of a material of an electron injection layer and a material of a second electrode on the emitting material layer. Namely, the electron injection layer, which is a layer formed by mixing the material of the electron injection layer and the material of the second electrode without a separate second electrode, may serve as an electron injection layer and a second electrode. In other words, the electron injection layer may include an electron injection material and a second electrode material.

In the method of manufacturing the organic electroluminescent device according to the present aspect, a mixed layer of the electron injection layer and the second electrode may be formed as a common electrode for two or more organic electroluminescent devices.

Examples of the method of coating the material of each layer may include a spin coating method, an ink-jet method, an electrostatic coating method, a method using ultrasonic atomization, a slit coating method, a die coating method, a screen printing method, and the like, but the present disclosure is not limited thereto.

<Display Device>

Figure 3:
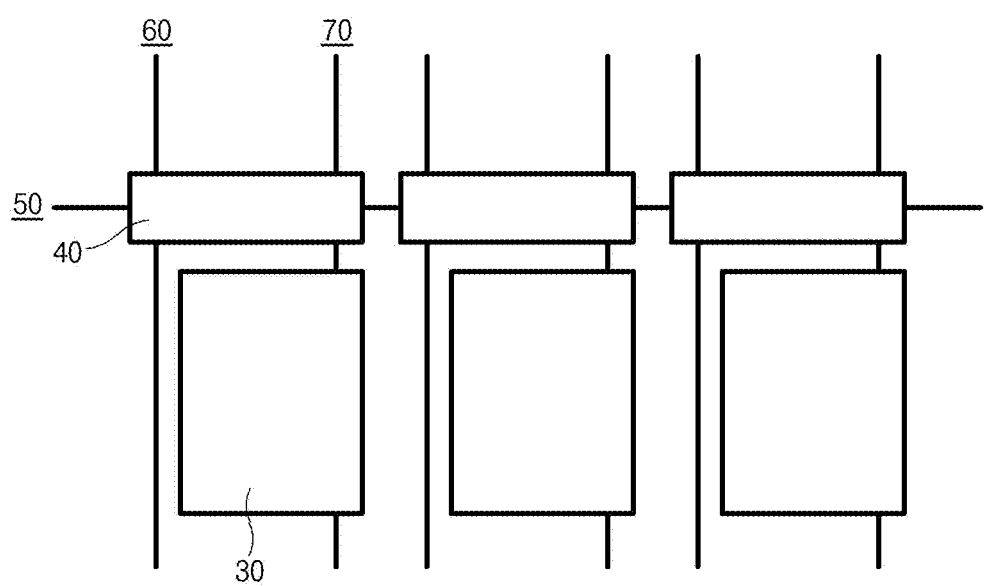
FIG. 3 is a schematic view illustrating a display device according to the present disclosure.

FIG. 3 is a schematic view illustrating a display device according to the present disclosure. In the aspect shown in FIG. 3, the organic electroluminescent device serves as a pixel. Further, in FIG. 3, an opposite electrode is omitted. The display device of the present disclosure includes the organic electroluminescent device of the present disclosure. In the display device of the present aspect, the organic electroluminescent device may serve as a pixel or a backlight. Components known in the art may be applied to other components of the display device.

For example, the display device includes a substrate (not shown), the organic electroluminescent device 30 over the substrate, and a thin film transistor circuit 40. The thin film transistor circuit 40 may include a switching thin film transistor (TFT) as a switching element and a driving TFT as a driving element. A gate line 50 and a data line 60 respectively extend along a first direction and a second direction and cross each other to define the pixel. In addition, a power line 70 extends along the second direction to be parallel to and spaced apart from the data line 60.

The switching TFT is connected to the gate line 50 and the data line 60, and the driving TFT is connected to the switching TFT, the power line 70 and the organic electroluminescent device 30. For example, the driving TFT may be positioned between the substrate and the organic electroluminescent device 30 and may be connected to the first electrode 10 (of FIG. 1) of the organic electroluminescent device. When the display device includes a first pixel, e.g., a red pixel, a second pixel, e.g., a green pixel, and a third pixel, e.g., b blue pixel, the organic electroluminescent device 30 may be separately formed in each pixel region.

The display device may further include an encapsulation film (not shown) of an insulating material. The encapsulation film covers and protects the organic electroluminescent device. When the electron injection layer EIL (of FIG. 1) in the organic electroluminescent device 30 has a function of an electron injection electrode without the second electrode 20 (of FIG. 1), the encapsulation film contacts the electron injection layer EIL. On the other hand, when the organic electroluminescent device 30 includes the second electrode 20, the encapsulation film contacts the second electrode 20.

In addition, the display device may include a liquid crystal panel and an organic electroluminescent device under a rear side of the liquid crystal panel. The organic electroluminescent device provides light toward the liquid crystal panel.

<Lighting Device>

A lighting device according to an aspect of the present disclosure includes the organic electroluminescent device of the present disclosure. In the lighting device of the present aspect, the organic electroluminescent device serves as a light-emitting portion. A configuration or the like known in the art may be applied to other configurations required for the lighting device.

For example, the lighting device may include a substrate and an organic electroluminescent device formed on an entire surface of the substrate. The lighting device may further include an encapsulation film (not shown) of an insulating material. The encapsulation film covers and protects the organic electroluminescent device. When the electron injection layer EIL (of FIG. 1) in the organic electroluminescent device 30 has a function of an electron injection electrode without the second electrode 20 (of FIG. 1), the encapsulation film contacts the electron injection layer EIL. On the other hand, when the organic electroluminescent device 30 includes the second electrode 20, the encapsulation film contacts the second electrode 20.

While the present disclosure has been described with reference to exemplary aspects, those skilled in the art should understand that various alterations and equivalent other aspects may be made to the aspects.

Therefore, the scope of aspects of the present disclosure is not limited thereto but encompasses several modifications and improvements by those skilled in the art using basic concepts of aspects of the present disclosure defined by the appended claims.

EXAMPLES

Hereinafter, the present disclosure will be described in more detail with reference to examples, but the interpretation of the present disclosure is not limited by these examples. Example of method of manufacturing organic electroluminescent device First process: An ITO-attached substrate was provided as a first electrode, and ultraviolet (UV) cleaning was performed thereon.

Second process: A material (PEDOT:PSS) of an hole injection layer is coated on the first electrode by a spin coating method.

Third process: A material (Livilux (registered trademark) SPG-01T (prepared by Sigma Aldrich)) of an emitting material layer is coated on the hole injection layer by a spin coating method.

Fourth process: An Na solution (Kobelco Eco-Solutions Co., Ltd.) containing N,N'-dimethylethyleneurea as an electron injection layer material and metal sodium monomers dissolved therein and an Ag paste (Dotite, FUJIKURA KASEI Co., Ltd.) as a second electrode material were mixed (1:1 vol %) and coated to form an electron injection layer serving as a second electrode by a spin coating method.

Measurement

A current in the obtained organic electroluminescent device with a constant voltage was measured. Results of the measurement are shown in FIG. 2.

Comparative Example

The first to third processes were performed in the same manner as the above example, and an Ag paste coating was performed by a spin coating method to form an electrode as a fourth process. A current in the obtained organic electroluminescent device with a constant voltage was measured in the same manner as in the above example. Results of the measurement are shown in FIG. 2.

Figure 2:
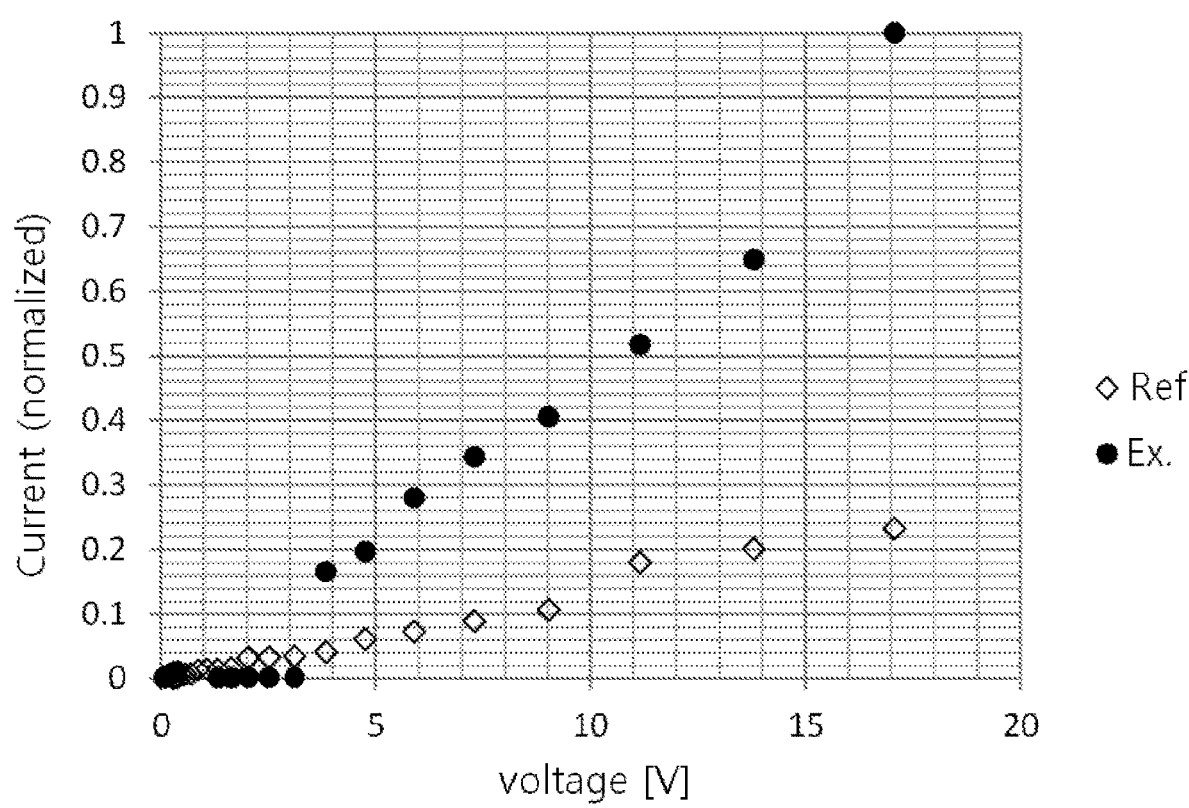
FIG. 2 is a graph showing results of measuring a current flowing when a voltage is applied to an organic electroluminescent device.

As shown in FIG. 2, in comparison to the organic electroluminescent device of the comparative example, a turn-on voltage in the organic electroluminescent device of the example was lowered and a current value in the organic electroluminescent device of the example was increased. It is considered that an electron injection barrier is lowered by the electron injection layer of the present disclosure.

As described above, it has become clear that, in the organic electroluminescent device of the present disclosure, an inter-electrode layer and at least one layer of a first electrode and a second electrode may be consistently manufactured at atmospheric pressure, and the organic electroluminescent device of the present disclosure may be an organic electroluminescent device with high efficiency.

What is claimed is:

1. An organic electroluminescent device, comprising:
a first electrode;
an electron injection layer facing the first electrode; and
an emitting material layer disposed between the first electrode and the electron injection layer,
wherein the emitting material layer and the electron injection layer are formable by coating, and
wherein the electron injection layer is formed from a composition containing a solution containing one of N,N'-dimethylethyleneurea, N,N-dimethylacetamide, and N,N'-dimethylpropyleneurea and a metal sodium monomer, and an Ag paste, and
wherein the electron injection layer is a top layer of the organic electroluminescent device.

2. The organic electroluminescent device of claim 1, wherein a light-emitting material of the emitting material layer includes an inorganic halide.

3. The organic electroluminescent device of claim 2, wherein the inorganic halide is a liquid crystal type metal halide.

4. The organic electroluminescent device of claim 1, further comprising an electron transporting layer between the emitting material layer and the electron injection layer.

5. The organic electroluminescent device of claim 4, further comprising a hole auxiliary layer between the emitting material layer and the first electrode.

6. The organic electroluminescent device of claim 5, wherein the hole auxiliary layer includes at least one of a hole injection layer and a hole transporting layer.

7. The organic electroluminescent device of claim 1, further comprising a second electrode on the electron injection layer.

8. A display device, comprising:
a substrate;
an organic electroluminescent device over the substrate and including:
a first electrode;
an electron injection layer facing the first electrode; and
an emitting material layer between the first electrode and the electron injection layer;
an encapsulation film covering the organic electroluminescent device; and
a thin film transistor between the substrate and the organic electroluminescent device and connected to the organic electroluminescent device,
wherein the emitting material layer and the electron injection layer are formable by coating, wherein the electron injection layer is formed from a composition containing a solution containing one of N,N'-dimethylethyleneurea, N,N-dimethyl acetamide, and N,N'-dimethylpropyleneurea and a metal sodium monomer, and an Ag paste, and
wherein the encapsulation film contacts the electron injection layer.

9. The display device of claim 8, wherein a light-emitting material of the emitting material layer includes an inorganic halide.

10. A lighting device, comprising:
a substrate;
an organic electroluminescent device over the substrate and including:
a first electrode;
an electron injection layer facing the first electrode; and
an emitting material layer between the first electrode and the electron injection layer; and
an encapsulation film covering the organic electroluminescent device,
wherein the emitting material layer and the electron injection layer are formable by coating,
wherein the electron injection layer is formed from a composition containing a solution containing one of N,N'-dimethylethyleneurea, N,N-dimethylacetamide, and N,N'-dimethylpropyleneurea and a metal sodium monomer, and an Ag paste, and
wherein the encapsulation film contacts the electron injection layer.

11. The lighting device of claim 10, wherein a light-emitting material of the emitting material layer includes an inorganic halide.

12. The display device of claim 8, wherein a volume ratio of the solution and the Ag past is 1:1.

13. The lighting device of claim 10, wherein a volume ratio of the solution and the Ag past is 1:1.

* * * * *